United States Patent [19]
Takase

[11] Patent Number: 6,022,789
[45] Date of Patent: Feb. 8, 2000

[54] METHOD OF SELECTIVE OXIDATION

[75] Inventor: Shunji Takase, Tokyo, Japan

[73] Assignee: Oki Electric Industry Co., Ltd., Tokyo, Japan

[21] Appl. No.: 09/126,846

[22] Filed: Jul. 31, 1998

[30] Foreign Application Priority Data

Sep. 3, 1997 [JP] Japan ................................. 9-238467

[51] Int. Cl.$^7$ ................................................ H01L 21/76
[52] U.S. Cl. ......................... 438/431; 438/430; 438/424; 438/425; 438/426; 438/427
[58] Field of Search .................................. 438/424, 425, 438/426, 430, 431, 427

[56] References Cited

U.S. PATENT DOCUMENTS 5,455,194  10/1995  Vasquez et al. ..................... 438/425
5,472,904  12/1995  Figura et al. ..................... 148/DIG. 50

*Primary Examiner*—Trung Dang
*Attorney, Agent, or Firm*—Jones Volentine, LLP

[57] ABSTRACT

A method of selective oxidation includes forming a mask layer which includes a silicon oxide film pattern and a silicon nitride film pattern on an active region defined on silicon substrate, a forming a trench using the mask layer in an isolation region defined in the silicon substrate adjoining the active region, forming a buried silicon oxide film in the trench, forming a buried poly-silicon film on the buried silicon oxide film in the trench, converting the buried poly-silicon film to a field oxide film, and removing the mask layer. The occurrence of a bird's beak during selective oxidation of the silicon can be prevented.

5 Claims, 7 Drawing Sheets

METHOD OF SELECTIVE OXIDATION

BACKGROUND OF THE INVENTION

1 Field of the Invention

The present invention generally relates to a method of selective oxidation, and more particularly, the present invention relates to a method for forming an isolation region.

This application is a counterpart of Japanese application Serial Number 238467/1997, filed Sep. 3, 1997, the subject matter of which is incorporated herein by reference.

2 Description of the Related Art

In general, a local oxidation (LOCOS) method has been used in the formation of an isolation region.

FIGS. 1A–1D are sectional views showing a conventional method of selective oxidation.

As shown in FIG. 1A, a silicon oxide film 12 is formed on a silicon substrate 10 using a thermal oxidation method. A silicon nitride film 14 is formed on the silicon oxide film 12 using a low-pressure chemical vapor deposition (LP-CVD) method.

As shown in FIG. 1B, the silicon oxide film 12 and the silicon nitride film 14 are patterned so as to remain on a plurality of active regions (not shown) defined on the silicon substrate 10 using a photolithography technique and an etching technique, and as a result the silicon oxide film patterns 12a and the silicon nitride film patterns 14a are formed on each active region of the silicon substrate 10.

As shown in FIG. 1C, a plurality of field oxide films 16 are formed on each isolation region defined on the silicon substrate 10 between the active regions using a thermal oxidation technique.

As shown in FIG. 1D, the silicon oxide film patterns 12a and the silicon nitride film patterns 14a are removed from the silicon substrate 10.

In the conventional method, it is desirable to prevent a problem of a lateral oxidation producing a so-called bird's beak during selective oxidation of the silicon.

SUMMARY OF THE INVENTION

An object of the present invention is to provide a method of selective oxidation that does not produce a bird's beak.

According to one aspect of the present invention, for achieving the above object, there is provided a method of selective oxidation comprising forming a mask layer which comprises a silicon oxide film pattern and a silicon nitride film pattern on an active region defined on a silicon substrate; forming a trench using the mask layer in an isolation region defined in the silicon substrate adjoining the active region; forming a buried silicon oxide film in the trench; forming a buried poly-silicon film on the buried silicon oxide film in the trench; converting the buried poly-silicon film to a field oxide film; and removing the mask layer.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A method of selective oxidation according to a first preferred embodiment of the present invention will hereinafter be described in detail with FIG. 2.

FIGS. 2A–2K are sectional views showing a method of selective oxidation according to a first preferred embodiment of the present invention.

Figure 1A:
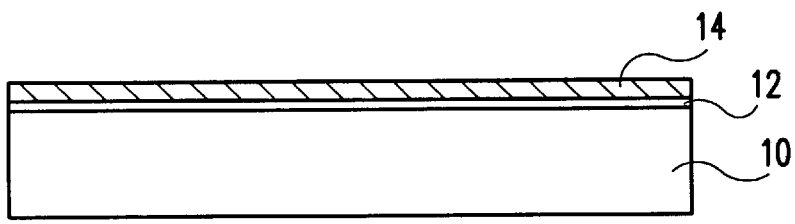
FIGS. 1A–1D are sectional views showing a conventional method of selective oxidation.
Figure 1B:
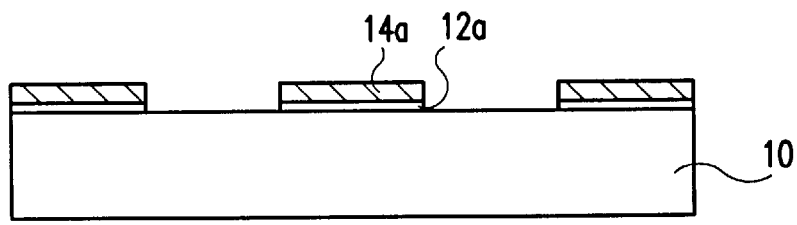
Figure 1C:
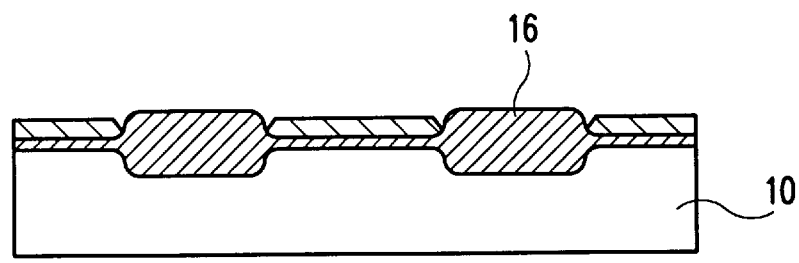
Figure 1D:
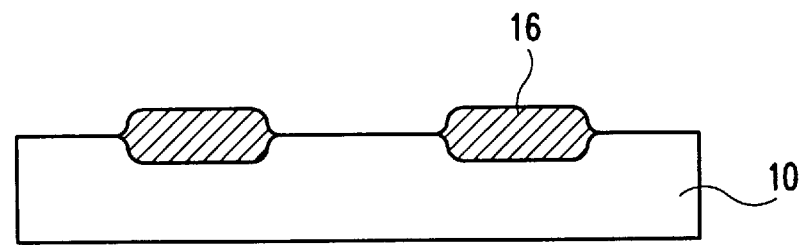
Figure 2A:
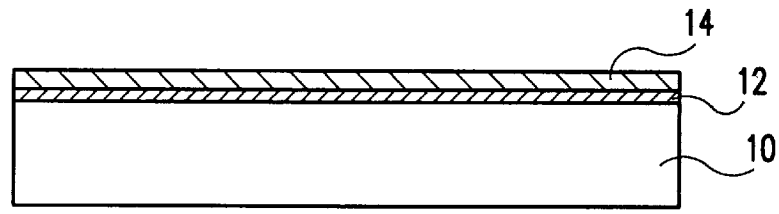
FIGS. 2A–2K are sectional views showing a method of selective oxidation according to a first preferred embodiment of the present invention.

As shown in FIG. 2A, a first silicon oxide film 12, having a thickness of 20 nm, is formed on a silicon substrate 10 using a thermal oxidation method. A silicon nitride film 14, having a thickness of 150 nm, is formed on the first silicon oxide film 12 using an LP-CVD method.

Figure 2B:
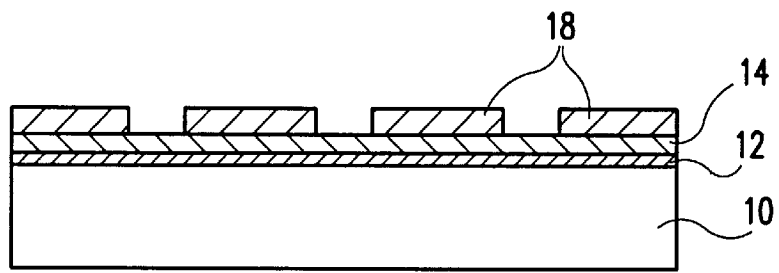

As shown in FIG. 2B, a plurality of resist patterns 18 are respectively formed using a photolithography technique on the silicon nitride film 14 over a plurality of active regions (not shown ) defined on the silicon substrate 10.

Figure 2C:
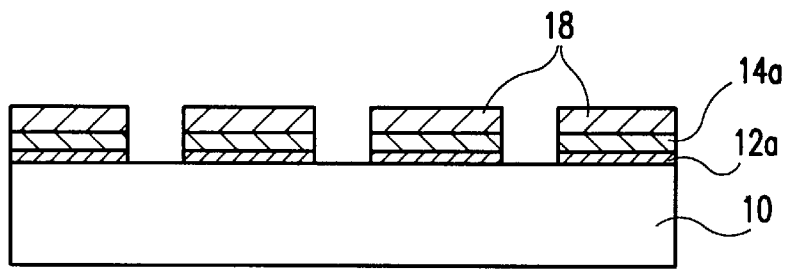

As shown in FIG. 2C, the first silicon oxide film 12 and the silicon nitride film 14 are etched using the plurality of resist patterns 18 as a plurality of masks to produce silicon oxide film patterns 12a and silicon nitride film patterns 14a. Here, $CF_4$ is used as the etching gas.

Figure 2D:
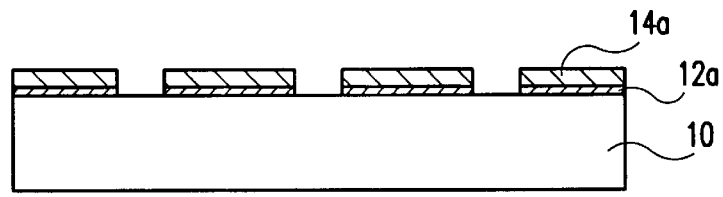

As shown in FIG. 2D, the plurality of resist patterns 18 are removed. The silicon oxide film patterns 12a and the silicon nitride film patterns 14a are formed on each of the active regions.

Figure 2E:
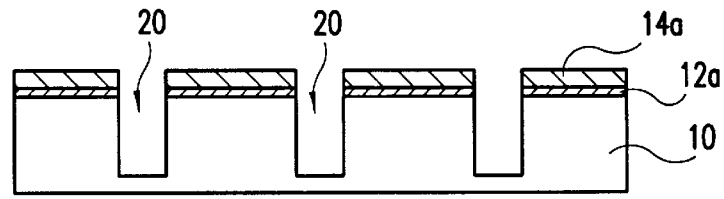

As shown in FIG. 2E, a plurality of trenches 20, each having a depth of 500 nm, are formed in isolation regions defined in the silicon substrate 10 between each active region. More specifically, the silicon substrate 10 in the isolation regions is dry-etched using the silicon nitride film patterns 14a as masks. Here, $Cl_2$ is used as the etching gas.

Figure 2F:
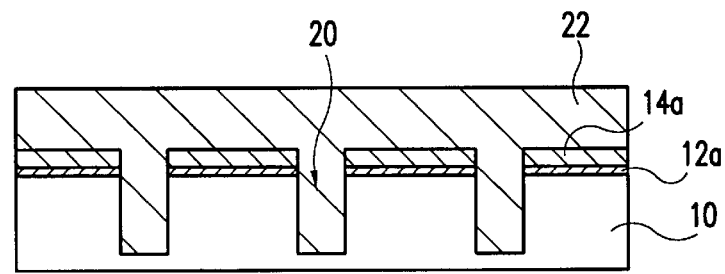

As shown in FIG. 2F, a second silicon oxide film 22 having a predetermined thickness, is formed on the silicon substrate 10, for example, a CVD process. Here, $SiH_4$ or TEOS are used as the source gas. The CVD method may be used either at atmospheric pressure or at a low pressure. The second silicon oxide film 22 has a sufficient thickness so as to completely fill in the plurality of trenches 20, and therefore the upper surture of the second silicon oxide film 22 is higher than upper surfaces of the silicon nitride film patterns 14a.

Figure 2G:
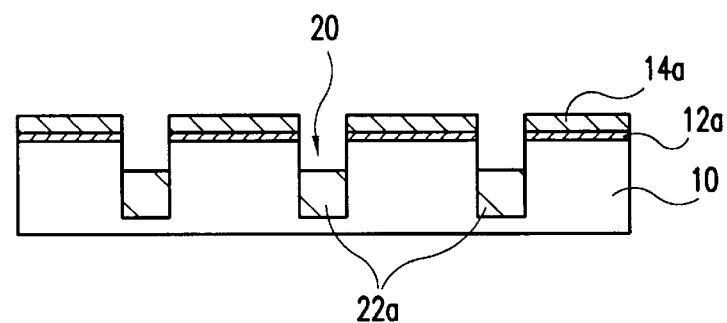

As shown in FIG. 2G, a plurality of buried silicon oxide films 22a are formed in the plurality of trenches 20 by patterning the second silicon oxide film 22. The patterning process is performed by an etch-back technique. Here, $CF_4$ is used as an etching gas for a dry-etching. The second silicon oxide film 22 is patterned so that the upper surface of the buried silicon oxide films 22a is lower than the interface between the silicon substrate 10 and the silicon oxide film patterns 12a Here, the distance between the interface and the buried silicon oxide films 22a is set to 200 nm~300 nm.

Figure 2H:
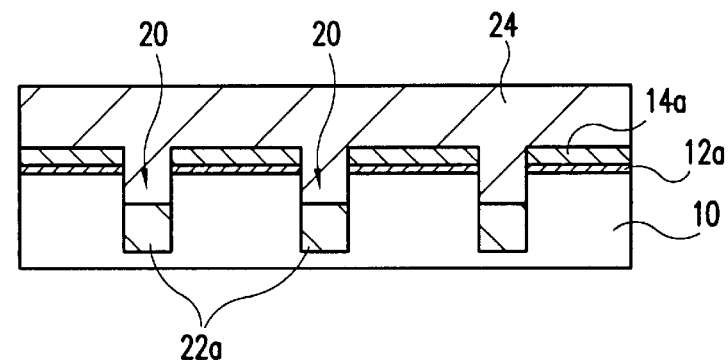

As shown in FIG. 2H, a poly-silicon film 24 is formed on the entire surface using an LP-CVD method. As a result, the poly-silicon film 24 is also buried in an upper space of the plurality of trenches 20. Here, SiH4 is used as source gas. The upper surfaces of the poly-silicon film 24 is higher than the upper surfaces of the silicon nitride film patterns 14a.

Figure 2I:
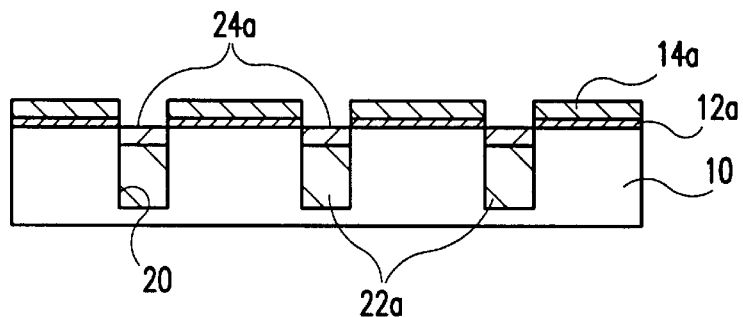

As shown in FIG. 2I, a plurality of buried poly-silicon films 24a are formed in the plurality of trenches 20 by patterning the poly-silicon film 24. The patterning process is performed by an etch-back technique using the silicon nitride film patterns 14a as masks. Here, $CF_4$ is used as an etching gas for a dry-etching. The poly-silicon film 24 is patterned so that the upper surface of the buried poly-silicon films 24a is substantially on a same plane as the interface between the silicon substrate 10 and the silicon oxide film patterns 12a Therefore, the buried poly-silicon films 24a are completely buried in the space of the plurality of trenches 20.

Figure 2J:
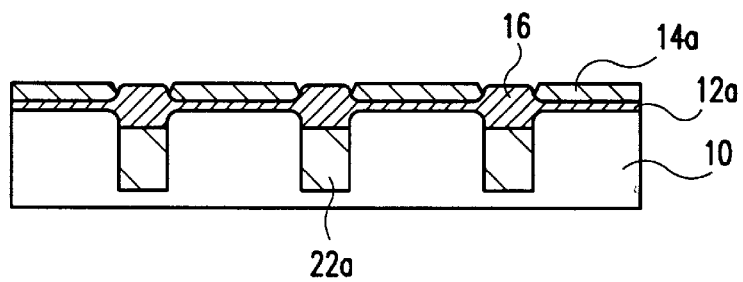

As shown in FIG. 2J, a plurality of field oxide films 16 are formed in the isolation region by the thermal oxidation of the buried poly-silicon films 24a. The thermal oxidation is performed using an mixed gas atmosphere of $H_2O$ and $O_2$ having a temperature 1000° C.~1050° C. In this time, the plurality of the buried poly-silicon films 24a are completely oxidized As a result, the plurality of field oxide films 16 are formed in the isolation region. The field oxide films 16 and the buried silicon oxide films 22a serve as an isolation layer between the active regions. Since the buried poly-silicon films 24a expand when they undergo thermal oxidation, the plurality of field oxide films 16 are completely buried in the plurality of trenches 20 even if the poly-silicon films 24 are etched too much in above etch-back process. Further, the first preferred embodiment can decrease the thermal oxidation rate compared to the conventional LOCOS process. As a result, the first preferred embodiment can prevent the lateral oxidation problem of the so-called bird's beak produced by the thermal oxidation.

Figure 2K:
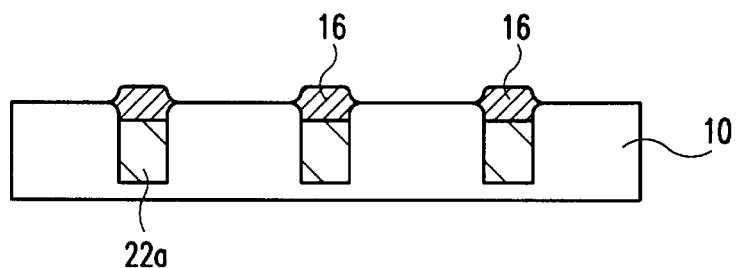

As shown in FIG. 2K, the silicon oxide film patterns 12a and the silicon nitride film patterns 14a are removed. Here, the silicon nitride film patterns 14a are removed using $H_3PO_4$, and the silicon oxide film patterns 12a are removed using 1%~5% $HF_{aq}$.

As mentioned above, since the buried poly-silicon films 24a expands when performing the thermal oxidation of the buried poly-silicon films 24a, the plurality of field oxide films 16 are completely buried in the plurality of trenches 20 even if the poly-silicon films 24 are etched too much in above etch-back process. Further, the first preferred embodiment can decrease the thermal oxidation rate compared to the conventional LOCOS process. As a result, the first preferred embodiment can prevent the problem of the so-called bird's beak due to lateral oxidation. Further, the first preferred embodiment can form suitable isolation layers by controlling the depth of the trenches. Although the described first preferred embodiment used poly-silicon films 24, an amorphous silicon may be used instead A method of selective oxidation according to a second preferred embodiment of the present invention will hereinafter be described in detail with FIGS. 3A–3K.

FIGS. 3A–3K are sectional views showing a method of selectively oxidation according to a second preferred embodiment of the present invention.

Figure 3A:
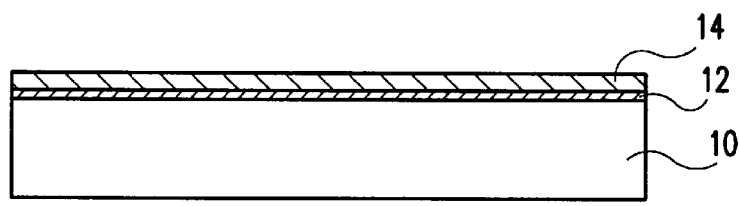
FIGS. 3A–3K are sectional views showing a method of selective oxidation according to a second preferred embodiment of the present invention.

As shown in FIG. 3A, a first silicon oxide film 12, having a thickness of 20 nm, is formed on a silicon substrate 10 using a thermal oxidation method. A silicon nitride film 14, having a thickness of 150 nm, is formed on the first silicon oxide film 12 using an LP-CVD method.

Figure 3B:
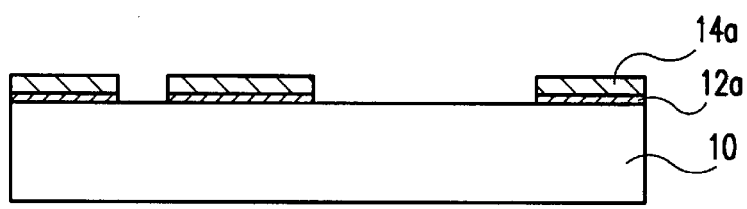

As shown in FIG. 3B, a plurality of resist patterns (not shown) are respectively formed on the silicon nitride film 14 over the plurality of active regions (not shown) defined on the silicon substrate 10 using a photolithography technique. The first silicon oxide film 12 and the silicon nitride film 14 are etched using the plurality of resist patterns as masks. Here, $CF_4$ is used as the etching gas. As a result, the silicon oxide film patterns 12a and the silicon nitride film patterns 14a are formed on each active region. After that, the plurality of resist patterns are removed.

Figure 3C:
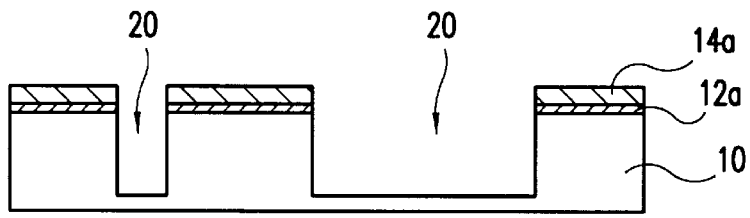

As shown in FIG. 3C, a plurality of trenches 20, having a depth of 500 nm, are formed in isolation regions defined in the silicon substrate 10 and between each of the active regions. More specifically, the silicon substrate 10 is dry-etched in isolation regions using the silicon nitride film patterns 14a as masks. Here, $Cl_2$ is used as the etching gas.

Figure 3D:
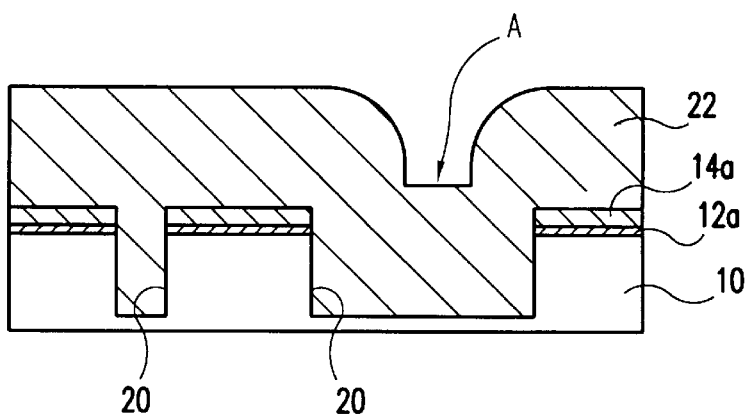

As shown in FIG. 3D, a second silicon oxide film 22 having a predetermined thickness, is formed on the silicon substrate 10 using the CVD method. Here, $SiH_4$ or TEOS are used as source gases. The CVD method may be used either at atmospheric pressure or at a low pressure. The thickness of the second silicon oxide film 22 is set to equal the sum of the depth of the trenches 20 and the thickness of the silicon oxide film patterns 12a and the silicon nitride film patterns 14a. The upper surface of the second silicon oxide film 22 is higher than the upper surfaces of the silicon nitride film patterns 14a. More specifically, a concave surface A of the second silicon oxide film 22 is higher than the upper surfaces of the silicon nitride film patterns 14a.

Figure 3E:
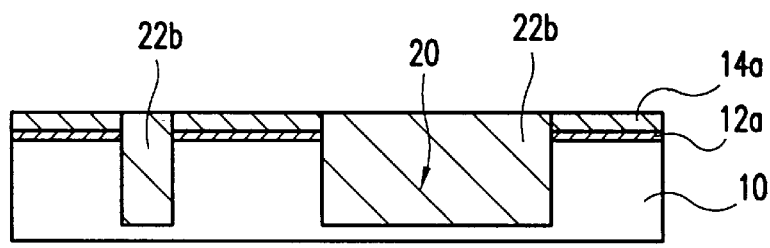

As shown in FIG. 3E, the second silicon oxide film 22 is polished using CMP (Chemical Mechanical Polish) to expose the upper surface of the silicon nitride film patterns 14a. As a result, a plurality of buried silicon oxide films 22b are formed in the plurality of trenches 20.

Figure 3F:
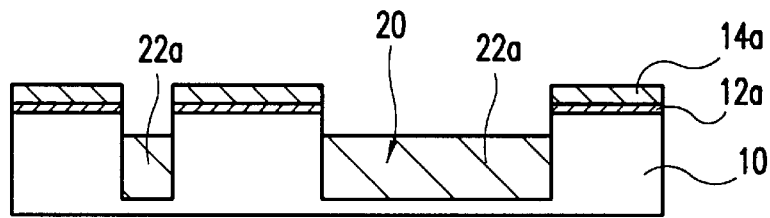

As shown in FIG. 3F, a plurality of buried silicon oxide films 22a are formed in the plurality of trenches 20 using an etch-back process of the second silicon oxide films 22. Here, $CF_4$ is used as an etching gas for dry-etching The second silicon oxide films 22 are etched back so that the upper surfaces of the buried silicon oxide films 22a is lower than the interface between the silicon substrate 10 and the silicon oxide film patterns 12a. Here, the distance between the interface and the buried silicon oxide films 22a is set to 200 nm~300 nm.

Figure 3G:
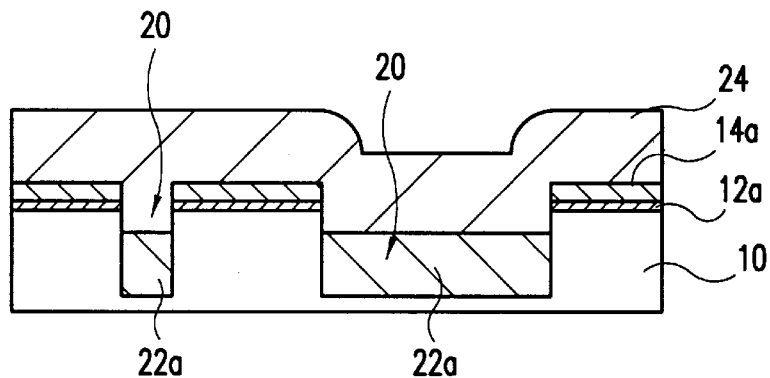

As shown in FIG. 3G, a poly-silicon film 24 is formed on the entire surface using an LP-CVD method As a result, the poly-silicon film 24, is also buried in an upper space of the plurality of trenches 20. Here, $SiH_4$ is used as source gas. The upper surface of the poly-silicon film 24 is higher than the upper surfaces of the silicon nitride film patterns 14a.

Figure 3H:
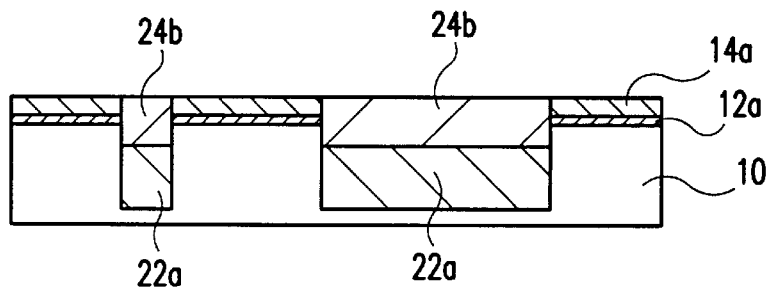

As shown in FIG. 3H, the poly-silicon film 24 is polished using CMP (Chemical Mechanical Polish) to expose the upper surface of the silicon nitride film patterns 14a. As a result, a plurality of buried poly-silicon films 24b are formed in the plurality of trenches 20.

Figure 3I:
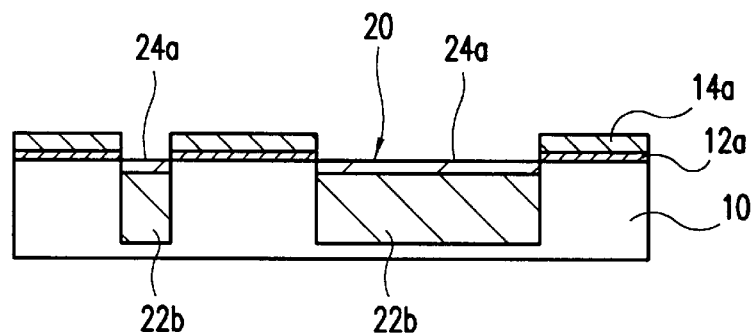

As shown in FIG. 3I, a plurality of buried poly-silicon films 24a are formed in the plurality of trenches 20 by etch-back of the poly-silicon films 24. Here, $CF_4$ is used as an etching gas for a dry-etching. The buried poly-silicon films 24b are etched back so that the upper surfaces of the buried poly-silicon films 24a are substantially on a same plane as the interface between the silicon substrate 10 and the silicon oxide film patterns 12a. Therefore, the buried poly-silicon films 24a are completely buried in the plurality of trenches 20.

Figure 3J:
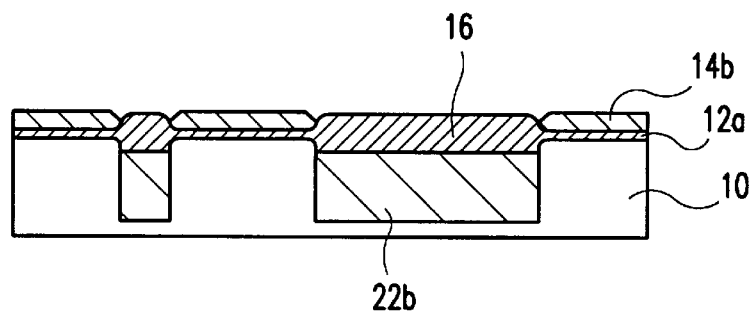

As shown in FIG. 3J, a plurality of field oxide films 16 are formed in the isolation region by thermal oxidation of the buried poly-silicon films 24a. The thermal oxidation is performed using a mixed gas atmosphere of $H_2O$ and $O_2$ having a temperature 1000° C.~1050° C. In this time, the plurality of the buried poly-silicon films 24a are completely oxidized As a result, the plurality of field oxide films 16 are formed in the isolation region. The field oxide films 16 and the buried silicon oxide films 22a serve as the isolation layer between the active regions. Since the buried poly-silicon films 24a expand when performing the thermal oxidation of the buried poly-silicon films 24a, the plurality of field oxide films 16 are completely buried in the plurality of trenches 20 even if the poly-silicon films 24 are etched too much in above etch-back process. Further, the second preferred embodiment can decrease the thermal oxidation degree compared to the conventional LOCOS process. As a result, the second preferred embodiment can prevent the problem of the so-called bird's beak due to lateral oxidation.

Figure 3K:
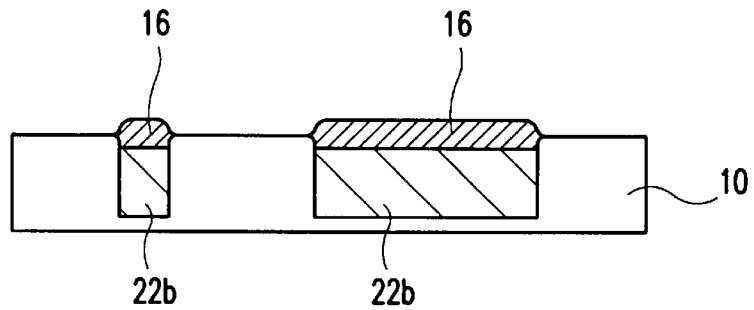

As shown in FIG. 3K, the silicon oxide film patterns 12a and the silicon nitride film patterns 14a are removed. The silicon nitride film patterns 14a are removed using $H_3PO_4$. The silicon oxide film patterns 12a are removed using 1%~5% HF.

As mentioned above, since the buried poly-silicon films 24a expand when undergoing thermal oxidation, the plurality of field oxide films 16 are completely buried in the plurality of trenches 20 even if the poly-silicon films 24 are etched too much in above etch-back process. Further, the second preferred embodiment can decrease the thermal oxidation rate compared to the conventional LOCOS process. As a result, the second preferred embodiment can prevent the problem of the so-called bird's beak due to the lateral oxidation. Further, the second preferred embodiment can form suitable isolation layers by controlling the depth of the trenches. Further, the second preferred embodiment can form isolation layers having irregular size without having a reliability problem.

Although the described second preferred embodiment used poly-silicon films 24, an amorphous silicon may be used instead.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of selective oxidation comprising:

forming a mask layer which comprises a silicon oxide film pattern and a silicon nitride film pattern on an active region defined on a silicon substrate;

forming a trench using the mask layer in an isolation region defined in the silicon substrate adjoining the active region;

forming a buried silicon oxide film in the trench;

forming a buried poly-silicon film on the buried silicon oxide film in the trench;

converting the buried poly-silicon film to a field oxide film; and removing the mask layer;

wherein said forming the buried silicon oxide film comprises:

depositing a silicon oxide film having a predetermined thickness on a top surface of the silicon substrate; and forming the buried silicon oxide film in the trench by patterning the silicon oxide film.

2. A method of selective oxidation as claimed in claim 1, wherein said depositing the silicon oxide film comprises a chemical vapor deposition.

3. A method of selective oxidation as claimed in claim 1, wherein said patterning the silicon oxide film comprises an etch-back process.

4. A method of selective oxidation as claimed in claim 3, wherein the buried silicon oxide film has a thickness which is less than a distance between a bottom of the trench and an interface between the silicon oxide film pattern and the silicon substrate.

5. A method of selective oxidation as claimed in claim 1, wherein the predetermined thickness is a sum of a depth of the trench and the thickness of the silicon oxide film pattern and the silicon nitride film pattern, and wherein said patterning the silicon oxide film comprises removing the silicon oxide film by polishing for the predetermined thickness and etching the silicon oxide film using an etch-back process.

* * * * *